United States Patent
Yuzurihara et al.

(10) Patent No.: US 10,244,615 B2
(45) Date of Patent: Mar. 26, 2019

(54) RADIO FREQUENCY POWER SOURCE DEVICE, AND POWER SOURCE FOR DUAL CATHODES

(71) Applicant: KYOSAN ELECTRIC MFG. CO., LTD., Yokohama-shi, Kanagawa (JP)

(72) Inventors: Itsuo Yuzurihara, Yokohama (JP); Shinichi Kodama, Yokohama (JP); Toshiyuki Adachi, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 15/542,977

(22) PCT Filed: Feb. 20, 2015

(86) PCT No.: PCT/JP2015/054727
§ 371 (c)(1),
(2) Date: Jul. 12, 2017

(87) PCT Pub. No.: WO2016/125316
PCT Pub. Date: Aug. 11, 2016

(65) Prior Publication Data
US 2018/0249570 A1    Aug. 30, 2018

(30) Foreign Application Priority Data
Feb. 4, 2015    (JP) .................. 2015-020482

(51) Int. Cl.
*H05H 1/46* (2006.01)
*H02M 5/42* (2006.01)
(Continued)

(52) U.S. Cl.
CPC ......... *H05H 1/46* (2013.01); *H01J 37/32174* (2013.01); *H01J 37/3438* (2013.01);
(Continued)

(58) Field of Classification Search
None
See application file for complete search history.

(56) References Cited

U.S. PATENT DOCUMENTS 6,159,867 A    12/2000    Sharan et al.
7,180,758 B2 *  2/2007    Lincoln .................. H02H 7/122
                                                        363/56.01
(Continued)

FOREIGN PATENT DOCUMENTS

| CN | 1358346 A | 7/2002 |
| CN | 101127486 A | 2/2008 |

(Continued)

OTHER PUBLICATIONS

Extended (supplementary) European Search Report dated Feb. 14, 2018, issued in counterpart European Application No. 15881133.1. (9 pages).
(Continued)

*Primary Examiner* — Crystal L Hammond
(74) *Attorney, Agent, or Firm* — Westerman, Hattori, Daniels & Adrian, LLP

(57) ABSTRACT

There is provided a radio frequency power source device configured to change a voltage ratio between two output end voltages, by switching a connection state of a voltage divider that divides the radio frequency voltage, in such a manner that the radio frequency voltage is divided into voltage outputs in antiphase with each other with respect to ground potential, and high voltage and low voltage are delivered in switching manner. Switching of the connection state in the voltage divider enables selective delivery of voltage having different values, high voltage or low voltage, and by selecting and delivering high voltage for the time high voltage is required, reduction of the voltage output from the radio frequency output circuit is prevented.

12 Claims, 10 Drawing Sheets

(51) Int. Cl.
  *H01L 21/203* (2006.01)
  *H01L 21/31* (2006.01)
  *H02M 5/08* (2006.01)
  *H02M 7/12* (2006.01)
  *H01J 37/32* (2006.01)
  *H01J 37/34* (2006.01)
  *C23C 14/34* (2006.01)

(52) U.S. Cl.
  CPC ........ *H01J 37/3444* (2013.01); *H01L 21/203* (2013.01); *H01L 21/31* (2013.01); *H02M 5/08* (2013.01); *H02M 5/42* (2013.01); *H02M 7/12* (2013.01); *C23C 14/34* (2013.01); *H05H 2001/4682* (2013.01)

(56) References Cited

U.S. PATENT DOCUMENTS

| | | | | |
|---|---|---|---|---|
| 9,402,128 | B2* | 7/2016 | Waller, Jr. | H04R 3/00 |
| 2004/0032212 | A1* | 2/2004 | Yuzurihara | H01J 37/32082 |
| | | | | 315/111.81 |
| 2006/0279969 | A1* | 12/2006 | Leung | H02M 3/33515 |
| | | | | 363/41 |
| 2010/0232180 | A1* | 9/2010 | Sase | H02M 3/33576 |
| | | | | 363/17 |
| 2013/0027983 | A1* | 1/2013 | Nate | H02M 3/335 |
| | | | | 363/21.01 |
| 2013/0187545 | A1* | 7/2013 | Richter | H01J 37/32036 |
| | | | | 315/111.21 |
| 2014/0346875 | A1* | 11/2014 | Chinga | H02M 7/53803 |
| | | | | 307/31 |
| 2015/0333708 | A1* | 11/2015 | Yuzurihara | H03F 1/086 |
| | | | | 330/251 |

FOREIGN PATENT DOCUMENTS

| | | |
|---|---|---|
| CN | 103038994 A | 4/2013 |
| JP | 4-54513 A | 2/1992 |
| JP | 7-337036 A | 12/1995 |
| JP | 2006-134603 A | 5/2006 |
| JP | 2010-248577 A | 11/2010 |
| JP | 2013-539160 A | 10/2013 |

OTHER PUBLICATIONS

International Search Report dated May 19, 2015, issued in counterpart application No. PCT/JP2015/054727,w/English translation. (3 pages).
Written Opinion dated May 19, 2015, issued in counterpart International Application No. PCT/JP2015/054727, w/ English translation (10 pages).
Decision of Grant a Patent dated Jul. 28, 2015, Issued in counterpart Japanese Patent Application No. 2015-020482, w/English translation (6 pages).
Taiwanese IPO Search Report dated Apr. 6, 2016, issued in counterpart of TW Patent Application No. 104119272 (2 pages).
Office Action dated Jan. 9, 2018, issued in counterpart China Application No. 201580074957.3, with English translation (9 Pages).
Notification of Transmittal of Translation of the International Preliminary Report on Patentability (Form PCT/IB/338) issued in counterpart International Application No. PCT/JP2015/054727 dated Aug. 17, 2017. (1 page).
International Preliminary Report on Patentability (Form PCT/IB/373) issued in counterpart International Application No. PCT/JP2015/054727 dated Aug. 8, 2017, with Form PCT/ISA/237. (7 pages).

* cited by examiner

FIG. 1B IGNITION OPERATION TIME

FIG. 1C PLASMA MAINTAINING STATE

FIG. 2B IGNITION OPERATION TIME

FIG. 2C PLASMA MAINTAINING STATE

FIG. 6B IGNITION OPERATION TIME

FIG. 6C PLASMA MAINTAINING STATE

FIG. 7B IGNITION OPERATION TIME

FIG. 7C PLASMA MAINTAINING STATE

FIG. 8B IGNITION OPERATION TIME

FIG. 8C PLASMA MAINTAINING STATE

RADIO FREQUENCY POWER SOURCE DEVICE, AND POWER SOURCE FOR DUAL CATHODES

TECHNICAL FIELD

The present invention relates to a radio frequency power source device for delivering AC voltage outputs in antiphase with each other, and a power source used for dual cathodes configured to apply the AC voltage outputs in antiphase with each other, respectively to two electrodes in a plasma chamber.

BACKGROUND ART

An apparatus such as a film forming apparatus and a sputtering apparatus, using plasma generated in a chamber, incorporates two electrodes (targets), and this kind of apparatus applies voltage in a manner referred to as a "dual cathodes system" that applies cathode-voltage and anode-voltage to the electrodes (targets), switched alternately, thereby generating plasma (see the patent document 1).

FIG. 9A illustrates schematically voltage application according to the dual cathodes system. The configuration shown in FIG. 9A is provided with two electrodes (targets) 101 and 102 disposed in a chamber, a radio frequency power source 103 configured to apply radio frequency voltage to the electrode (target) 101, a radio frequency power source 104 configured to apply radio frequency voltage to the electrode (target) 102, and a switching unit 105.

The switching unit 105 performs switching between the radio frequency power source 103 and the radio frequency power source 104, so as to feed alternately radio frequency voltage outputs with different polarities, to the electrode 101 and the electrode 102, respectively. The radio frequency voltage outputs in antiphase with each other are applied, respectively to a pair of electrodes, that is, while applying cathode voltage to one electrode, anode voltage is applied to the other electrode. Similarly, while applying anode voltage to one electrode, cathode voltage is applied to the other electrode.

By applying the radio frequency voltages in antiphase with each other, electric charges accumulated in the electrode 101 and the electrode 102 are canceled, thereby maintaining stable plasma (see Patent Document 1).

FIG. 9B illustrates a configuration including one radio frequency power source for applying voltage in a dual cathodes system. The configuration as shown in FIG. 9B is provided with two electrodes (targets) 111 and 112 disposed in a chamber, one radio frequency power source 113 for applying radio frequency voltage to the electrodes (targets) 111 and 112, a switching circuit 115 for applying radio frequency voltage to each of a pair of the electrodes 111 and 112, alternately by switching, and an AC power source 116 for applying AC voltage to each of the electrodes in such a manner that cathode and anode are replaced by each other between the pair of the electrodes (targets).

In this configuration, the radio frequency power source 113 is commonly used for the pair of the electrodes (targets), and the radio frequency voltage outputs generated by the radio frequency power source 113 are applied, being superimposed on AC voltage generated by the AC power source 116, in such a manner as alternately switched between the electrodes (targets) (see Patent Document 2).

PRIOR ART DOCUMENT

Patent Document

Patent Document 1
Japanese Unexamined Patent Application Publication No. 2006-134603 (paragraph [0025])
Patent Document 2
Japanese Unexamined Patent Application Publication No. 2010-248577 (paragraphs [0006] to [0009])

DISCLOSURE OF THE INVENTION

Problems to be Solved by the Invention

In the configuration as shown in FIG. 9A, since one radio frequency power source is used for one electrode (target), two radio frequency power source devices are required to be prepared for a pair of electrodes, and this is a factor in hampering device-downsizing and reduction of production cost.

To solve the problem above, there is suggested the configuration as shown in FIG. 9B. In this configuration, one radio frequency power source is used for a pair of electrodes (targets), thereby achieving device downsizing and enhancing productivity. In the configuration as shown in FIG. 9B, however, it is necessary to provide a switching circuit 115 and an AC power source 116, in addition to the radio frequency power source for delivering radio frequency voltage, so as to change cathode and anode alternately between the pair of electrodes (targets).

There is another configuration as shown in FIG. 9C where neither the switching means nor the AC power source are necessary in the configuration that uses one radio frequency power source for a pair of electrodes (targets).

The radio frequency power source device 121 as shown in FIG. 9C includes a voltage divider 124 that is connected in parallel with an output end of a radio frequency output circuit 122 via a transformer 123, the voltage divider comprising capacitive elements 125 and 126 connected in series, and a middle point between the capacitive elements 125 and 126 is grounded. The voltage divider 124 divides voltage Vab between the output ends a and b of the radio frequency output circuit 122, the voltage being obtained via the transformer 123, into two voltage outputs in association with the capacitive element 125 and the capacitive element 126, in alternating manner. Since the middle point between the capacitive elements 125 and 126 is at ground potential, the output end A and the output end B deliver the voltage outputs Va and Vb, respectively, being AC voltage outputs in antiphase with each other, each having a half peak value of the voltage Vab (Vab/2).

A pair of electrodes 131 and 132 are connected respectively to the output end A and the output end B, thereby applying the voltage outputs respectively to the electrodes 131 and 132, switching between anode and cathode alternately.

In some cases, a radio frequency power source device is required to deliver voltage outputs having various voltage values; from high to low. By way of example, when the plasma generator is used as a load, high voltage is applied to the electrode as ignition voltage when igniting plasma, whereas voltage lower than the ignition voltage is applied to maintain the plasma after ignited. In generating plasma using a power source for dual cathodes, igniting plasma requires to apply AC voltage having a peak value higher than the peak value of AC voltage that is used when plasma is maintained.

The radio frequency power source device with the configuration as shown in FIG. 9C outputs constant voltage, and voltage having a constant peak value is delivered on all occasions. This results in that high voltage required for igniting plasma is applied even for the time to maintain the plasma, causing a problem such as failing to fully respond to the requirement for the load as to a voltage value.

Therefore, there is a problem that in the configuration to divide the output from the radio frequency output circuit into two, voltage outputs having various values such as high voltage and low voltage, cannot be delivered.

In the configuration of FIG. 9C, it is not necessary to provide the switching circuit 115 for switching the radio frequency voltage, nor the AC power source 116 for counterchanging cathode and anode alternately between a pair of the electrodes (targets). However, the peak value of the voltage at the output end becomes half of the voltage output of the radio frequency output circuit, resulting in that only a half of the peak value of the output voltage from the radio frequency output circuit is applied to each electrode on the load side. Accordingly, this may cause a problem that sufficient voltage for igniting plasma cannot be obtained.

FIG. 10 illustrates a configuration where radio frequency voltage is supplied to a plasma generator 130 via wiring cables 141 and 142 from the radio frequency power source device 121 which is shown in FIG. 9C.

As illustrated in FIG. 10, also in the configuration where radio frequency voltage is supplied via the wiring cables 141 and 142, each peak value of the voltage outputs Va and Vb of the AC voltage, which are applied to the electrodes 131 and 132, respectively, becomes half of the voltage output Vab of the radio frequency output circuit, similar to the voltage outputs at the output ends of the radio frequency power source device, as expressed by the following formulas 1 and 2.

When inductance and capacitance of the wiring cables 141 and 142 are assumed as Lla, Llb, Cla, and Clb, the voltage output Va of the AC voltage applied to the electrode A is expressed by the following formula 1, since an external line of the wiring cables 141 and 142 is grounded. When radio frequency voltage in the frequency range from tens of kHz to hundreds of kHz is used, the inductance Lla and Llb of the wiring cables can be omitted. Therefore, the following formula 1 is represented by the capacitance Ca and Cb of the voltage divider on the radio frequency power source device side, and the capacitance Cla and Clb of the wiring cables:

$$Va = [(Cb + Clb)/\{(Ca + Cla) + (Cb + Clb)\}] \cdot Vab \quad (1)$$

The formula 1 can be represented by the formula 2 where Ca=Cb, Cla=Clb:

$$Va = \{(Ca + Cla)/2(Ca + Cla)\} \cdot Vab = Vab/2 \quad (2)$$

As described above, in the radio frequency power source device provided with the voltage divider comprising the capacitive elements being connected in series, as shown in FIG. 9C, each of the voltage output Va and Vb is limited to half of the voltage output Vab of the radio frequency output circuit.

To manage the problem that the output voltage is restricted to such low voltage, it is possible to raise the peak value of the voltage output of the radio frequency output circuit provided in the radio frequency power source device, so as to obtain high voltage necessary for igniting plasma. However, implementation of a high-power in radio frequency output circuit may cause device upsizing and increase in cost.

Thus, the configuration to divide the output from the radio frequency output circuit into two, in the radio frequency power source device for outputting AC voltage in antiphase with each other, includes the following problems;

a) voltage outputs with different voltage values, high voltage and low voltage, cannot be delivered in a manner being switched as necessary, b) the voltage at the output end is lowered to half of the peak value of the voltage output of the radio frequency output circuit, and c) the peak value of the voltage applied to the electrode on the load side becomes half of the voltage output of the radio frequency output circuit, and this may lead to failure in igniting plasma, when the voltage is fed into the plasma load.

To solve the aforementioned problems, there are following objects of the present invention which is directed to a radio frequency power source device for outputting AC voltage in antiphase with each other, provided with a configuration to divide an output from the radio frequency output circuit into two;

a) delivering voltage outputs with different values selectively, high voltage or low voltage;

b) preventing a voltage drop from the voltage output of the radio frequency output circuit at the output end of the radio frequency power source device, when high voltage is to be delivered; and c) when voltage is supplied to a plasma load, delivering high voltage sufficient for igniting plasma, upon igniting plasma, whereas delivering low voltage sufficient for maintaining the plasma during the plasma maintaining time.

Means for Solving the Problems

The present invention is directed to a radio frequency power source device that changes a ratio of voltage outputs at two output ends, by switching a connection state of a voltage divider for dividing radio frequency voltage into AC voltage outputs in antiphase with each other, with respect to ground potential, and voltage outputs are delivered in such a manner as switching between high voltage and low voltage.

The present invention enables delivering voltage outputs with different voltage values selectively, high voltage or low voltage, by changing the connection state of the voltage divider. In addition, high voltage is selected at an output end of the radio frequency power source device, when high voltage is to be delivered, thereby preventing the voltage output of the radio frequency output circuit from being reduced. When voltage is supplied to a plasma load, high voltage sufficient for igniting plasma can be delivered upon igniting plasma, whereas low voltage sufficient for maintaining plasma can be delivered when the plasma is maintained.

The radio frequency power source device according to the present invention outputs AC voltage outputs in antiphase with each other, in a configuration provided with an AC power source, a radio frequency output circuit for converting source voltage of the AC power source to have a given frequency to deliver radio frequency voltage, and a voltage divider for dividing the radio frequency voltage delivered from the radio frequency output circuit into AC voltage outputs in antiphase with each other with respect to a ground potential.

The voltage divider according to the present invention is provided with a series circuit where two capacitive elements, a first capacitive element and a second capacitive element, are connected in series, assuming that a middle point between output ends of the radio frequency output circuit is at ground potential, and a changeover circuit for switching a connection state of one of the output ends of the radio frequency output circuit and/or the ground potential, with at least either one of the capacitive elements of the series circuit. In the changeover circuit, a ratio between the voltages across each of the two capacitive elements with respect to the ground potential is variable, and high voltage and low voltage are delivered by switching.

There are more than one embodiments of the changeover circuit provided in the radio frequency power source device of the present invention.

In the first and the second embodiments of the changeover circuit, the connection state of the ground potential is switched to change the voltage output, and in the third and the fourth embodiments of the changeover circuit, capacities of the capacitive elements are switched to change the voltage output.

First Embodiment of the Changeover Circuit According to the Present Invention

The first embodiment of the changeover circuit according to the present invention is provided with a switch circuit between the ends of at least either one of two capacitive elements in a series circuit that includes a series connection of the first capacitive element and the second capacitive element, the switch circuit being configured to short-circuit or open-circuit between an output end of one capacitive element of a radio frequency output circuit and a ground potential. Short-circuiting operation is an operation to close the switch circuit, and open-circuiting operation is an operation to open the switch circuit.

In the short-circuiting operation of the switch circuit, the output end of one capacitive element side serves as the ground potential, causing the output end voltage of the radio frequency output circuit to be zero, and the output end voltage on the other capacitive element side to become equal to the voltage output of the radio frequency output circuit.

This short-circuiting operation of the switch circuit allows high voltage of the radio frequency output circuit to be delivered from the output end of the radio frequency power source device.

On the other hand, the open-circuiting operation of the switch circuit causes the voltage at the output ends of the radio frequency output circuit to become dividing voltages obtained by dividing the output voltage, in accordance with the capacities of both the capacitive elements.

This open-circuiting operation of the switch circuit allows low voltage obtained by voltage dividing to be delivered from the two output ends of the radio frequency power source device.

There are plural configurations as the switch circuit of the first embodiment, which are electrically equivalent in connecting the switch circuit to the radio frequency circuit.

In a first configuration, the switch circuit is provided between one output end of the radio frequency output circuit and the ground potential. According to the first configuration, by closing the switch circuit, one output end of the radio frequency output circuit serves as the ground potential, causing a peak value of the output voltage to be zero, and the voltage output of the radio frequency output circuit is delivered only from the other output end. On the other hand, by opening the switch circuit, one output end of the radio frequency output circuit is insulated from the ground potential, and two voltage outputs obtained by dividing the voltage output of the radio frequency output circuit by a voltage divider, are delivered from the respective output ends.

In the second configuration, the switch circuit is provided between one output end of the radio frequency output circuit and the middle point. According to the second embodiment, by closing the switch circuit, one output end of the radio frequency output circuit is connected to the middle point of the voltage divider, so as to serve as the ground potential, causing the peak value of the output voltage to be zero, and the voltage output of the radio frequency output circuit is delivered only from the other output end. On the other hand, by opening the switch circuit, one output end of the radio frequency output circuit is insulated from the middle point, and two voltage outputs obtained by dividing the voltage output of the radio frequency output circuit by the voltage divider, are delivered from the respective output ends.

In the third configuration, the switch circuit connects in parallel with one capacitive element. According to the third configuration, by closing the switch circuit, short-circuiting occurs with the connected capacitive element, and one output end of the radio frequency output circuit serves as the ground potential, causing the peak value of the output voltage to be zero, and the voltage output of the radio frequency output circuit is delivered only from the other output end. On the other hand, by opening the switch circuit, two voltage outputs obtained by dividing the voltage output of the radio frequency output circuit by the voltage divider, are delivered from the respective output ends.

The first to the third configurations of the switch circuit are electrically equivalent, and by closing the switch circuit, the output voltage at one output end becomes zero, the voltage output of the radio frequency output circuit is delivered only from the other output end. On the other hand, by opening the switch circuit, two voltage outputs obtained by dividing the voltage output of the radio frequency output circuit, are delivered from the respective output ends.

The changeover circuit of the first embodiment may be provided on one of the output ends or both of the output ends, with regard to the two output ends of the radio frequency output circuit. When the changeover circuits are provided on only one of the two output ends of the radio frequency output circuit, the output voltage at the output end on the side where the changeover circuit is provided becomes zero, allowing the output voltage on the other output end to be the voltage output of the radio frequency output circuit. When the changeover circuit is provided on both of the two output ends of the radio frequency output circuit, one changeover circuit of either one of them is selected to perform switching operation, and the other changeover circuit is used in the open state.

Second Embodiment of the Changeover Circuit According to the Present Invention

The second embodiment of the changeover circuit according to the present invention is provided with a changeover switch for connecting a ground potential in switching manner, with a middle point of two capacitive elements in the series circuit, or with the output end of the radio frequency output circuit on one capacitive element side.

On the changeover switch, the middle point of the two capacitive elements of the series circuit is switched to be at the ground potential thereby causing the output end voltage on both capacitive element sides of the radio frequency output circuit, to be dividing voltage outputs which are obtained by dividing the voltage output of the radio frequency output circuit according to the capacities of both capacitive elements.

On the other hand, the output end of the radio frequency output circuit on one capacitive element side is switched to be at the ground potential, thereby causing the out-out end voltage of the radio frequency output circuit on one capacitive element side to be zero, and the output end voltage on the other capacitive element side to be the voltage output of the radio frequency output circuit.

The changeover circuit of the second embodiment may be provided either one or both of the two output ends of the radio frequency output circuit. When the changeover circuit is provided on either one of the two output ends of the radio frequency output circuit, the output voltage at the output end where the changeover circuit is provided is allowed to be zero, and the output voltage at the other output end is allowed to be the voltage output of the radio frequency output circuit. When the changeover circuits are provided on both two output ends of the radio frequency output circuit, either one of the changeover circuits is selected for performing the switching operation, and the other changeover circuit is used in the open state.

Third Embodiment of the Changeover Circuit According to the Present Invention

The third embodiment of the changeover circuit according to the present invention is provided with a changeover switch for connecting a third capacitive element in series with either one of the two capacitive elements of the series circuit.

In switching the changeover switch, the third capacitive element is connected in series, in a manner that a peak value of the output end voltage of the radio frequency output circuit on the other capacitive element side is set to be higher than the output end voltage on one capacitive element side.

On the other hand, when the third capacitive element is separated, the output end voltages on both capacitive element sides of the radio frequency output circuit, to be dividing outputs which are obtained by dividing the voltage output of the radio frequency output circuit, in accordance with the capacities of both capacitive elements.

The changeover circuit of the third embodiment may be provided on either one of the output end sides or on both sides, as to the two output ends of the radio frequency output circuit. When the changeover circuit is provided at either one of the two output ends of the radio frequency output circuit, the output voltage may become low at the output end where the changeover circuit is provided, and the output voltage may become high at the other output end. When the changeover circuits are provided respectively on both two output ends of the radio frequency output circuit, they are used in such a manner that either one of the changeover circuits is selected to perform switching operation, keeping the other changeover circuit in the open state.

Fourth Embodiment of the Changeover Circuit

The fourth embodiment of the changeover circuit is provided with a changeover switch for connecting a fourth capacitive element in parallel with either one of the two capacitive elements of the series circuit.

In switching the changeover switch, the fourth capacitive element is connected in parallel, in a manner that a peak value of the output end voltage of the radio frequency output circuit on the other capacitive element side is set to be higher than the output end voltage on one capacitive element side.

On the other hand, when the fourth capacitive element is separated, the output end voltages on both capacitive element sides of the radio frequency output circuit, to be dividing outputs which are obtained by dividing the voltage output of the radio frequency output circuit, in accordance with the capacities of both capacitive elements.

The changeover circuit of the fourth embodiment may be provided on either one of the output end sides or on both sides thereof, as to the two output ends of the radio frequency output circuit. When the changeover circuit is provided at either one of the two output ends of the radio frequency output circuit, the output voltage may become high at the output end where the changeover circuit is provided, and the output voltage may become low at the other output end. When the changeover circuits are provided respectively on both two output ends of the radio frequency output circuit, the changeover circuit is used in such a manner that either one of the changeover circuits is selected to perform switching operation, keeping the other changeover circuit in the open state.

(Power Source for Dual Cathodes)

The radio frequency power source device of the present invention can be applied to a power source for dual cathodes used for applying AC voltage outputs in antiphase with each other to two electrodes in a plasma chamber. The power source for dual cathodes of the present invention is provided with the aforementioned radio frequency power source device, and a control circuit for controlling an ignition operating state for igniting plasma within the plasma chamber and a plasma maintaining state for maintaining the plasma thus ignited.

The control circuit of the present invention controls the changeover circuit according to the current passing through the electrodes, so as to change a voltage ratio in the ignition operating state and a voltage ratio in the plasma maintaining state. In the ignition operating state, a ratio of voltage at one electrode for igniting plasma out of the two electrodes is increased, and in the plasma maintaining state, ratios of voltage at the two electrodes are equalized. On the other hand, in the ignition operating state, when the ignition current passing through the electrode for igniting plasma exceeds a set value, the changeover circuit changes the connecting state so as to switch to the plasma maintaining state.

Advantage of the Invention

As discussed in the foregoing description, according to the present invention, it is possible to deliver different voltage values, selectively, high voltage or low voltage.

In addition, at the output ends of the radio frequency power source device, it is possible to prevent voltage reduction from the voltage output of the radio frequency output circuit, when high voltage has to be delivered.

When voltage is supplied to the plasma load, high voltage sufficient for igniting plasma can be delivered when plasma is ignited, and when plasma is maintained, low voltage sufficient for maintaining the plasma can be delivered.

BRIEF DESCRIPTION OF THE DRAWINGS

FIG. 1A to FIG. 1C illustrate a schematic configuration of a radio frequency power source device according to the present invention;

FIG. 2A to FIG. 2D illustrate a first configuration and operation examples of a changeover circuit according to the present invention;

FIG. 6A to FIG. 6E illustrate a second configuration and control examples of the changeover circuit according to the present invention;

FIG. 7A to FIG. 7C illustrate a third configuration and control examples of the changeover circuit according to the present invention;

FIG. 8A to FIG. 8C illustrate a fourth configuration and control examples of the changeover circuit according to the present invention;

BEST MODE FOR CARRYING OUT THE INVENTION

With reference to FIGS. 1 to 8, a radio frequency power source device and a power source for dual cathodes according to the present invention will be described.

Figure 1A:
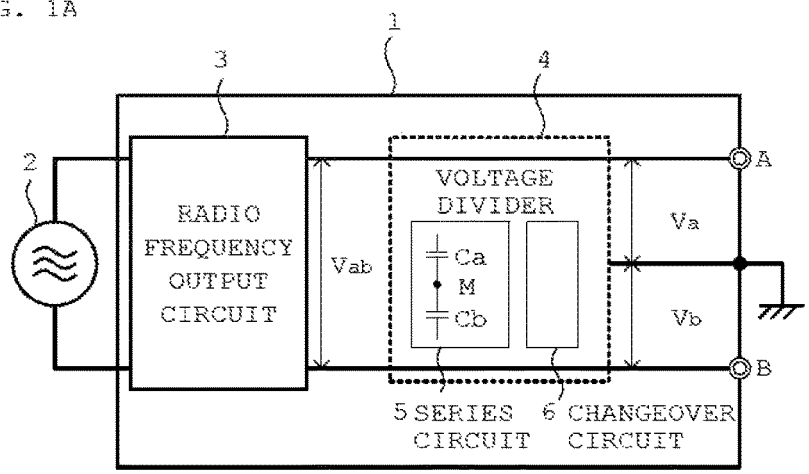
Figure 1A:
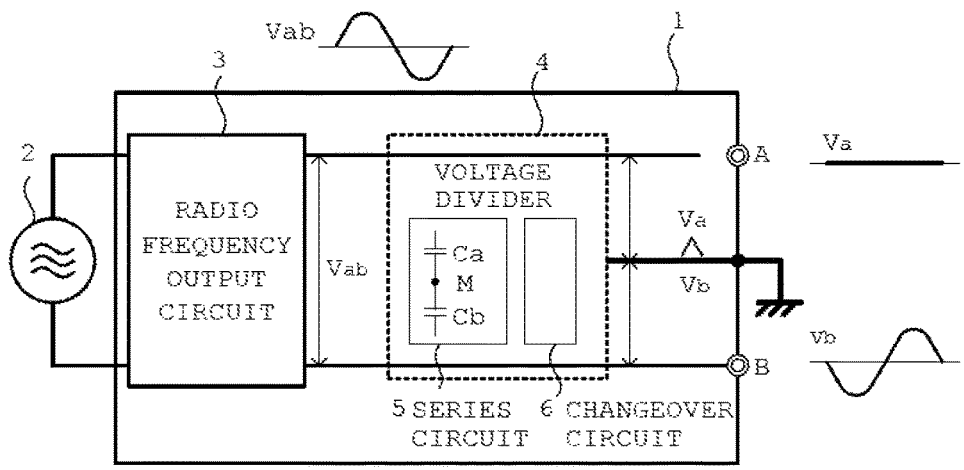
Figure 1A:
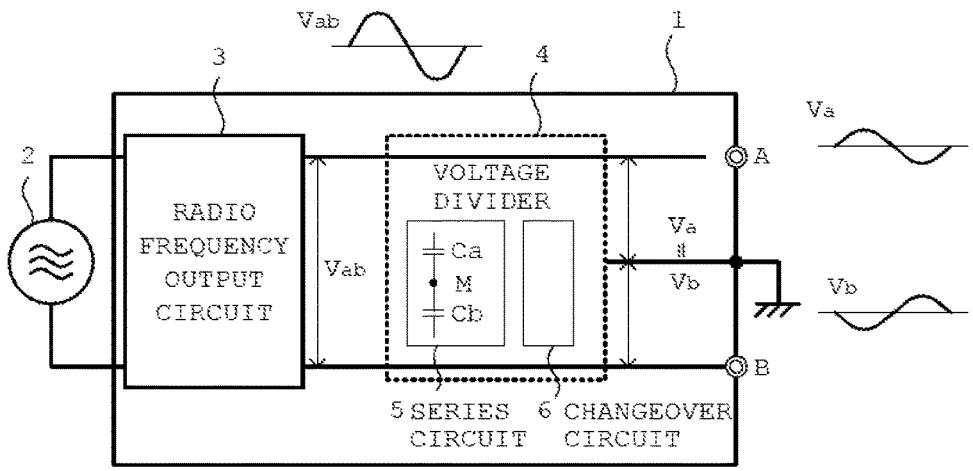

With reference to FIG. 1, a schematic configuration of the radio frequency power source device according to the present invention will be described, with reference to FIG. 2, a first configuration and operation examples of a changeover circuit according to the present invention will be described, with reference to FIGS. 3 and 4, a configuration example and a control example of the power source for dual cathodes according to the present invention will be described, with reference to FIG. 5, a modification example of the first configuration of the changeover circuit according to the present invention will be described, with reference to FIG. 6, a second configuration and operation examples of the changeover circuit according to the present invention will be described, with reference to FIG. 7, a third configuration and operation examples of the changeover circuit according to the present invention will be described, and with reference to FIG. 8, a fourth configuration and operation examples of the changeover circuit according to the present invention will be described.

(Configuration of the Present Invention)

FIG. 1 illustrates a schematic configuration of the radio frequency power source device according to the present invention. FIG. 1A illustrates a schematic configuration, and FIG. 1B and FIG. 1C illustrate, respectively, a state of igniting operation for igniting plasma and a state of plasma maintaining after plasma is ignited, in the case where voltage is supplied from the radio frequency power source device to a plasma load.

In FIG. 1A, the radio frequency power source device 1 is provided with an AC power source 2, a radio frequency output circuit 3 for converting the voltage from the AC power source 2 into voltage at a given frequency to deliver radio frequency voltage, and a voltage divider 4 for dividing the radio frequency voltage delivered from the radio frequency output circuit 3, into AC voltage outputs in antiphase with each other with respect to a ground potential, and delivering AC voltage outputs in antiphase with each other respectively from the output ends A and B.

The voltage divider 4 is provided with a series circuit 5 where two capacitive elements, the first capacitive element Ca and the second capacitive element Cb are connected in series, and the middle point M between the output ends a and b of the radio frequency output circuit 3 is at ground potential, and a changeover circuit 6 for switching the connection state of one of the output ends of the radio frequency output circuit 3 and/or the ground potential, with at least either one of the capacitive elements of the series circuit 5, so as to achieve variable voltage-ratios between the voltage outputs Va and Vb of the two capacitive elements Ca and Cb, with respect to the ground potential, and to deliver voltage which is switched between high voltage and low voltage.

When voltage is fed into the plasma load from the radio frequency power source device, the output voltage is supplied to the plasma load from the output ends A and B. The output voltage is supplied to the plasma load, by connecting the output ends A and B respectively with a pair of electrodes disposed in a chamber, directly or via wiring cables.

In applying voltage in a dual cathodes system, AC voltage outputs in antiphase with each other are applied, respectively to a pair of electrodes disposed in the chamber. In generating plasma, an ignition operation for igniting plasma in the chamber, and a plasma maintaining operation for maintaining plasma ignited by the ignition operation are performed. In the ignition operation, high voltage is applied to the electrodes in the chamber for igniting the plasma.

Ignition Operation:

FIG. 1B illustrates the ignition operation. In the radio frequency power source device of the present invention, when igniting plasma in the chamber according to the ignition operation, it is sufficient that at least one of the electrodes disposed in the chamber enters the ignited state. Therefore, the voltage output delivered from either one of the output ends A and B, which are configured to deliver the voltage outputs divided by the dividing circuit 4, is raised to high voltage, and this high voltage is applied to one of the electrodes, so as to ignite plasma.

During the ignition operation, relative to the high voltage delivered from one output end, the voltage output delivered from the other output end becomes low. The electrode to which the low voltage is applied does not contribute to plasma ignition, since the applied voltage is not high enough to ignite plasma. On the other hand, the electrode to which high voltage is applied is used for the plasma ignition operation, and plasma is ignited on this electrode side, resulting in that plasma is generated in the chamber.

FIG. 1B illustrates an example where assuming the output voltage from the changeover circuit 6 as Va<Vb, low voltage output Va is delivered from the output end A, and high voltage output Vb is delivered from the output end B. By way of example, the voltage output Vab from the radio frequency output circuit 3 may serve as high voltage, and ground voltage may serve as low voltage. Settings in the changeover circuit 6 may determine which of the output end A and the output end B may serve as the output end for high voltage, and which may serve as the output end for low voltage. Accordingly, it is also possible to deliver high voltage output Va from the output end A and low voltage output Vb from the output end B, by switching the output state in the changeover circuit 6.

Plasma Maintaining State:

FIG. 1C illustrate a state of plasma maintaining. After plasma is generated in the chamber by the ignition operation, the plasma thus generated is maintained by applying plasma maintaining voltage to the pair of electrodes in the chamber. The voltage applied on this occasion is to maintain the plasma being generated, and thus, it is not necessary to be high voltage as applied at the ignition time, and low voltage is sufficient.

FIG. 1B shows an example that the changeover circuit 6 divides the voltage output Vab of the radio frequency output circuit 3 into half; and Va (=Vab/2) is delivered as the voltage outputs Va, and Vb (=Vab/2) is delivered as the voltage output Vb. Since the middle point M of the series circuit 5 is at a ground potential, the voltage output Va and the voltage output Vb are in antiphase with each other.

The aforementioned FIG. 1B and FIG. 1C illustrate examples of a plasma load in the dual cathodes system, as the load to which the radio frequency power source device 1 supplies voltage, which applies voltage outputs in antiphase with each other to the pair of electrodes, respectively. However, the load to which the radio frequency power source device of the present invention supplies voltage is not limited to the plasma load. It is applicable to any load to which voltage outputs in antiphase with each other are applied, allowing high voltage and low voltage to be delivered to the load, in a switching manner.

(First Configuration and Operation of the Changeover Circuit According to the Present Invention)

FIG. 2 illustrates a first configuration and operation examples of the changeover circuit according to the present invention. In FIG. 2, the radio frequency output circuit is not illustrated, and the series circuit and the changeover circuit incorporated in the voltage divider are shown.

Figure 2A:
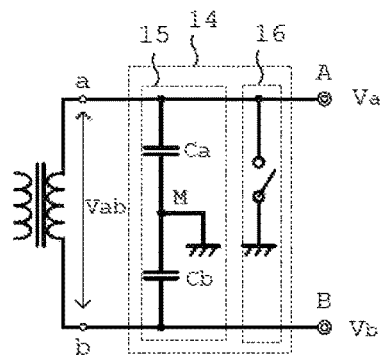
Figure 2A:
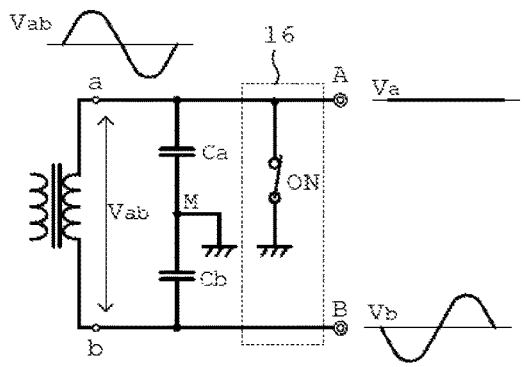
Figure 2A:
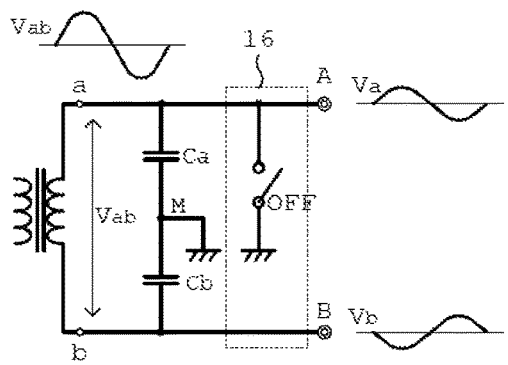
Figure 2D:
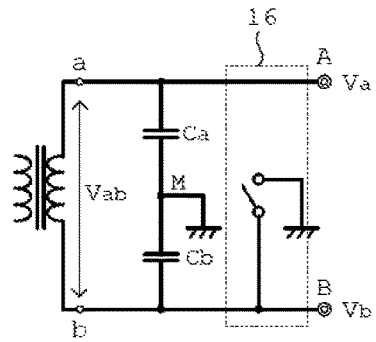

FIG. 2A shows a schematic configuration, and FIG. 2B and FIG. 2C illustrate, respectively, the ignition operation time and the plasma maintaining state after ignited, when voltage is supplied from the radio frequency power source device to the plasma load. FIG. 2D shows a modification example of the first configuration.

In FIG. 2A, the voltage divider 14 which is provided with the series circuit 15 and the changeover circuit 16, divides the voltage Vab between the output ends a and b of the radio frequency output circuit, along with switching the outputs, and then delivers the voltage output Va from the output end A, and voltage the output Vb from output end B.

The series circuit 15 connects the first capacitive element Ca and the second capacitive element Cb in series, between the output ends a and b of the radio frequency output circuit, along with grounding the middle point M to put the point at ground potential.

The changeover circuit 16 comprises a switch circuit for connection or separation between either of the output end A and the output end B, and the ground potential. The changeover circuit 16 shown in FIG. 2A is an example that includes the switch circuit for connection and separation between the output end A and the ground potential.

Ignition Operation Time:

FIG. 2B shows an example to deliver low voltage output Va from the output end A, and high voltage output Vb from the output end B, as the voltage output from the changeover circuit 16, where Va<Vb. At the time of ignition operation, the changeover circuit 16 sets the switch circuit to be closed (on-state), thereby putting the output end A at ground potential. According to this switching, the voltage output Va of the output end A becomes ground voltage, and the output end B delivers the output voltage having the same peak value as the voltage output Vab of the radio frequency output circuit in antiphase.

Plasma Maintaining State:

FIG. 2C illustrates the state where plasma is maintained. After plasma is generated according to the ignition operation, voltage for maintaining plasma is applied to the pair of electrodes in the chamber, thereby maintaining the plasma thus generated. In the state where plasma is maintained, the changeover circuit 16 opens the switch circuit (off-state), and separates the output end A from the ground potential. With this switching, the voltage output Va is delivered from the output end A, having a half peak value of the voltage output Vab of the radio frequency output circuit in the same phase, and the voltage output Vb is delivered from the output end B, having a half peak value of the voltage output Vab of the radio frequency output circuit in antiphase.

FIG. 2D shows a modification example of the first configuration. In the configuration example as shown in FIG. 2D, the switch circuit is provided between the output end B and the ground potential in the changeover circuit 16, and the output end B is connected with or separated from the ground potential. In the configuration as shown in FIG. 2D, the switch circuit in the changeover circuit 16 is closed (on-state) at the time of ignition operation, then the output end B is put at ground potential, and the voltage output Vb at the output end B becomes ground voltage. Then, the voltage output Va is delivered from the output end A, having the same peak value as the voltage output Vab of the radio frequency output circuit in the same phase.

(Modification Example of the Switch Circuit in the First Configuration of the Changeover Circuit According to the Present Invention)

With reference to FIG. 3, there will be described a modification example of the switch circuit in the first configuration of the changeover circuit according to the present invention. When the switch circuit is connected to the radio frequency circuit, there are plural examples being electrically equivalent, as the switch circuit of the first configuration of the changeover circuit.

Figure 3A:
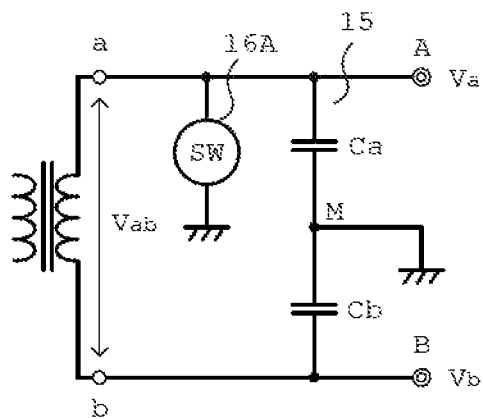
FIG. 3A to FIG. 3C illustrate a modification example of the changeover circuit according to the present invention.

FIG. 3A illustrates a first modification example of the switch circuit. The first modification example provides the switch circuit 16A in the voltage divider 14, on one output end a of the radio frequency output circuit or between the output end a of the radio frequency output circuit or the output end A of the radio frequency power source circuit, and the ground potential.

According to the first modification example, the switch circuit 16A is closed to become in the on-state, then causing one output end a of the radio frequency output circuit and the output end A of the Radio frequency power source device to be at ground potential, setting zero to the peak value of the voltage output Va at the output end A, and delivers the voltage output Vab of the radio frequency output circuit only from the other output end B. On the other hand, the switch circuit 16A is opened to become in the off-state, then causing the output end a of the radio frequency output circuit and the output end A of the radio frequency power source device to be insulated from ground potential, and the voltage Va is delivered from the output end A, and the voltage Vb is delivered from the output end B, being obtained by dividing the voltage output of the radio frequency output circuit by the voltage divider 14.

Figure 3B:
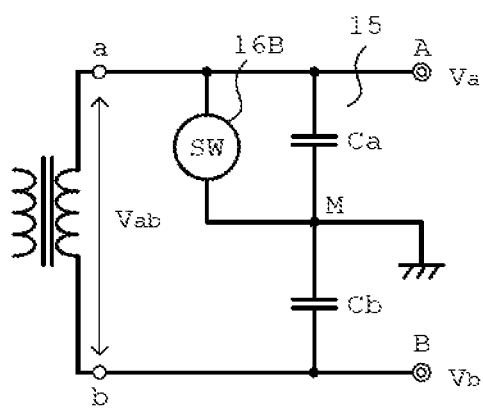

FIG. 3B illustrates a second modification example of the switch circuit. The second modification example provides the switch circuit 16B in the voltage divider 14, on one output end a of the radio frequency output circuit or between the output end a of the radio frequency output circuit and the output end A of the radio frequency power source device, and the middle point M.

According to the second modification example, the switch circuit 16B is closed to become in the on-state, then causing the output end a of the radio frequency output circuit and the output end A of the radio frequency power source device to connect to the middle point M of the voltage divider, leading to the ground potential to set zero as the peak value of the voltage output Va, and then, the voltage output Vab of the radio frequency output circuit is delivered only from the other output end B. On the other hand, the switch circuit 16B is opened to become in the off-state, then, the output end a of the radio frequency output circuit and the output end A of the radio frequency power source device are insulated from the middle point M. Then, the voltage Va is delivered from the output end A and the voltage Vb is delivered from the output end B, being obtained by dividing the voltage output Vab of the radio frequency output circuit by the voltage divider 14.

Figure 3C:
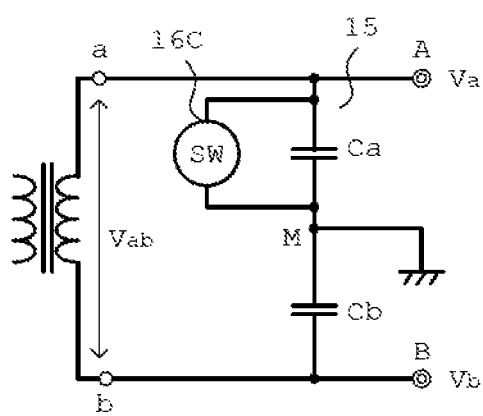

FIG. 3C illustrates a third modification example of the switch circuit. The third modification example connects the switch circuit 16C in parallel with one capacitive element Ca in the voltage divider 14. According to the third modification example, the switch circuit 16C is closed and in the on-state, thereby short-circuiting across between both ends of one capacitive element Ca, then causing the output end a of the radio frequency output circuit and the output end A of the radio frequency power source device to be at ground potential, setting zero as the peak value of the voltage output Va, and the voltage output Vab of the radio frequency output circuit is delivered only from the other output end B. On the other hand, by opening the switch circuit 16C to become in the off-state, the voltage Va is delivered from the output end A and the voltage Vb is delivered from the output end B, being obtained by dividing the voltage output Vab of the radio frequency output circuit by the voltage divider 14.

FIGS. 3A to 3C illustrate examples to dispose the switch circuits 16A, 16B, and 16C at the first capacitive element Ca side, but it is also possible to provide the switch circuits on the second capacitive element Cb side.

The first to the third modification examples of the switch circuit are electrically equivalent. By closing the switch circuit, the output voltage from one output end becomes zero, and the output voltage of the radio frequency output circuit is delivered only from the other output end. By opening the switch circuit, two types of voltage outputs obtained by dividing the voltage output of the radio frequency output circuit are delivered from both output ends, respectively.

(Configuration Example and Controls of the Power Source for Dual Cathodes According to the Present Invention)

Figure 4:
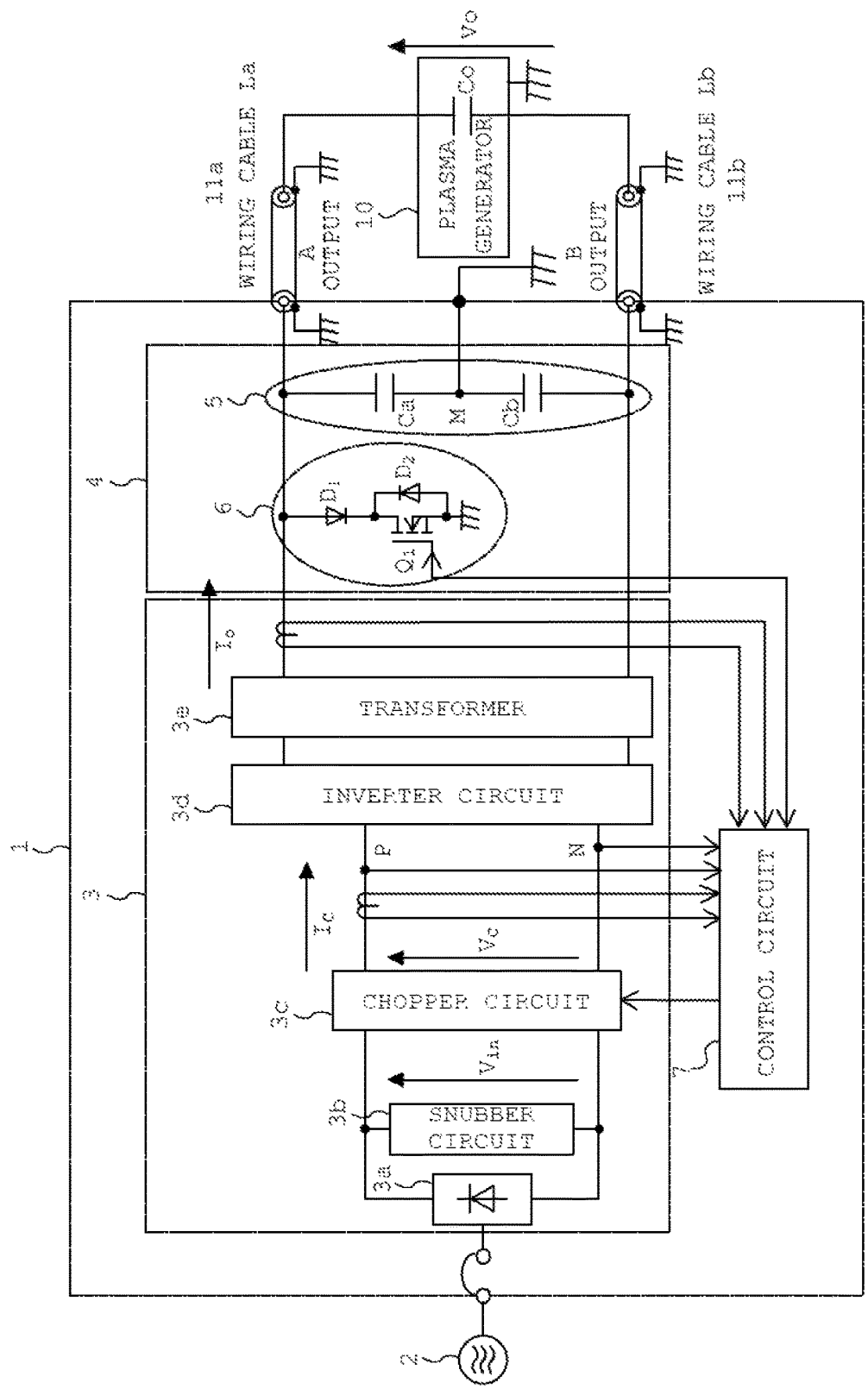
FIG. 4 illustrates a configuration example and a control example of a power source for dual cathodes according to the present invention.

With reference to FIG. 4, there will be described a configuration and controls of a power source for dual cathodes, incorporating the radio frequency power source device according to the present invention.

In FIG. 4, the power source for dual cathodes is provided with the radio frequency power source device 1, and a control circuit 7 for controlling the operating states of the ignition operation state for igniting plasma in a plasma chamber, and the plasma maintaining state for maintaining the plasma being ignited.

The radio frequency power source device 1 is provided with a radio frequency output circuit 3 and a voltage divider 4, and the voltage divider 4 is provided with a series circuit 5 comprising a first capacitive element Ca and a second capacitive element Cb connected in series, and a changeover circuit 6.

As one configuration example, the radio frequency output circuit 3 is provided with a rectifier 3a for rectifying AC voltage from the AC power source 2, a snubber circuit 3b constituting a protection circuit for controlling high voltage transiently generated, a chopper circuit 3c for converting inputted DC voltage Vin into a certain voltage output Vc, an inverter circuit 3d for converting DC output to AC output, and a transformer 3e for converting voltage of the AC output from the inverter circuit, into a certain voltage.

The series circuit 5 comprises the first capacitive element Ca and the second capacitive element Cb connected in series, establishing connection between the output end A and the output end B, and further the middle point M between the first capacitive element Ca and the second capacitive element Cb is grounded.

The changeover circuit 6 comprises a switch circuit disposed between the output end A side and the ground potential, and the switch circuit comprises a series circuit of a diode D1 setting the direction from the output end A to the ground as a forward direction, and a switching element Q1 connected to a diode D2 inversely directed. By turning on the switching element Q1, the output end Aside is grounded, thereby causing the voltage output Va on the output end A to be at ground potential.

In FIG. 4, the plasma generator 10 is illustrated as a load, and the output end A and the output end B are connected, respectively, to a pair of electrodes provided in the plasma generator 10, via the wiring cables 11a and 11b.

The control circuit 7 feeds back voltage output Vc of the chopper circuit 3c, current Ic passing from the chopper circuit 3c to the inverter circuit 3d, and current Io passing from the transformer 3e to the output ends A and B, thereby controlling the chopper circuit 3c and the switching element Q1 of the changeover circuit 6.

Figure 5:
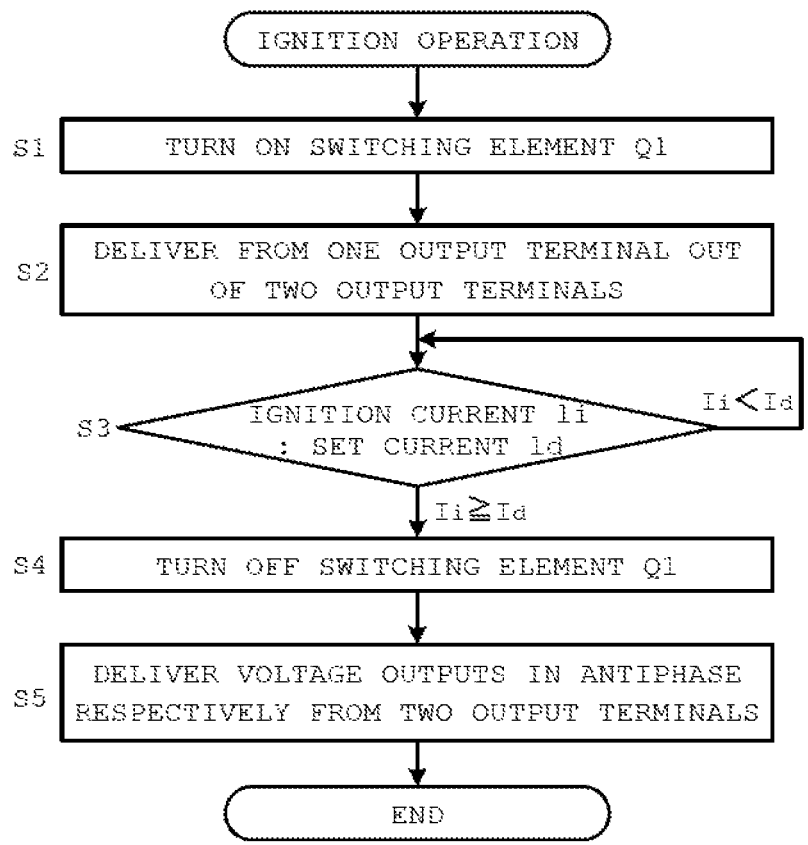
FIG. 5 illustrates a configuration example and a control example of the power source for dual cathodes according to the present invention.

FIG. 5 is a flowchart showing that the control circuit establishes connection for the ignition operation. In controlling the switching element Q1 of the changeover circuit 6, the switching element Q1 is closed to be the on-state, upon the ignition operation (S1), and the voltage output Vab of the radio frequency output circuit is applied from the output end B, to one of the electrodes in the plasma generator 10, thereby starting the ignition operation (S2).

When plasma is ignited according to the ignition operation, the ignition current Ii is increased. The control circuit 7 feeds back the current Io being detected as the ignition current Ii, and compares this detected current with a set current Id for determining the plasma ignitions state. When the ignition current Ii reaches and exceeds the set current Id (S3), it is determined that plasma is ignited, and the switching element Q1 is opened to become the off-state (S4), delivers voltage in antiphase with each other respectively from the output end A and the output end B, and maintains thus generated plasma (S5).

(Second Configuration and Operations of the Changeover Circuit According to the Present Invention)

FIG. 6 illustrates the second configuration and operations of the changeover circuit according to the present invention. The radio frequency output circuit is not illustrated in FIG. 6, and configuration examples of the series circuit and the changeover circuit provided in the voltage divider are shown.

Figure 6A:
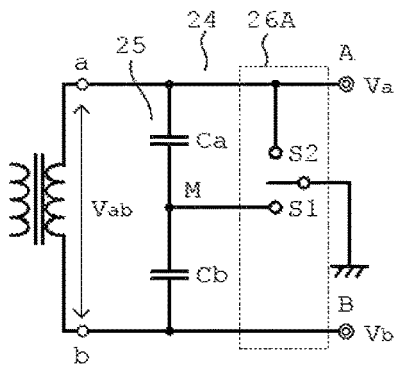
Figure 6A:
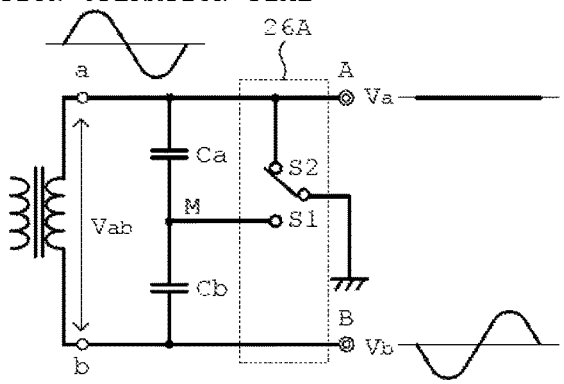
Figure 6A:
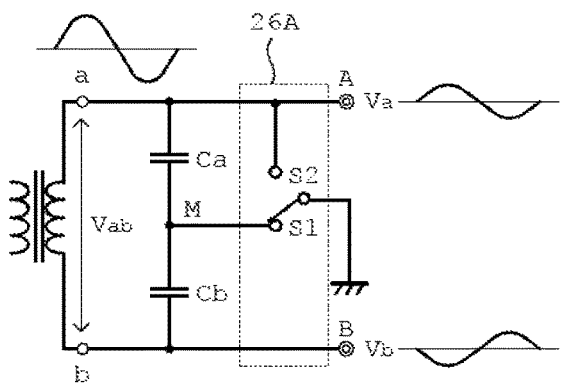
Figure 6D:
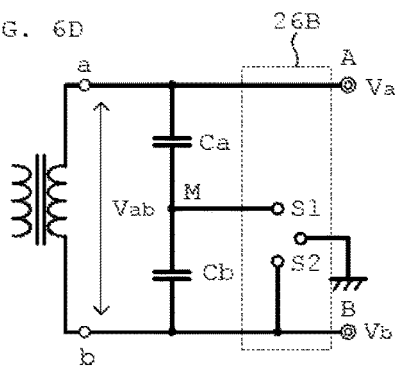
Figure 6E:
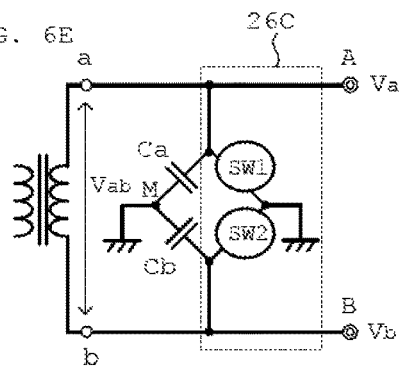

FIG. 6A illustrates a schematic configuration, and FIG. 6B and FIG. 6C respectively illustrate the ignition operation time for igniting plasma, and the plasma maintaining state after the ignition, when voltage is supplied from the radio frequency power source device to the plasma load. FIG. 6D and FIG. 6E illustrate modification examples of the second configuration.

In FIG. 6A, the voltage divider 24 is provided with a series circuit 25 and a changeover circuit 26, divides the output Vab between the output ends a and b of the radio frequency output circuit, switches the outputs, and then, delivers the voltage output Va from the output end A, and delivers the voltage output Vb from the output end B.

The series circuit 25 connects the first capacitive element Ca and the second capacitive element Cb connected in series, between the output ends a and b of the radio frequency output circuit, along with the middle point M, which is to be put at a ground potential.

The changeover circuit 26 comprises a switch circuit for connection or separation between either of the output ends A and B, and the middle point M of the series circuit, with respect to the ground potential. FIG. 6A shows a configuration example of the changeover circuit 26 where the contact point S1 switches between connection of the middle point M of the series circuit 25 with the ground potential and separation therefrom, and the contact point S2 switches between connection of the output end A with the ground potential and separation therefrom.

Ignition Operation Time:

FIG. 6B illustrates the example where the contact point S2 of the changeover circuit 26 is connected to the ground potential, causing the output end A to be at the ground potential, and the voltage output Vb having the same peak value as the voltage output Vab of the radio frequency output circuit is delivered from the output end B.

At the time of ignition operation, the changeover circuit 26 connects the contact point S2 to the ground, thereby switching the output end A to be at the ground potential. This switching causes the voltage output Va of the output end A to be grounded, and the voltage output Vb is delivered from the output end B, having the same peak value as the voltage output Vab of the radio frequency output circuit in antiphase.

Plasma Maintaining State:

FIG. 6C illustrates the state where plasma is maintained. After plasma is generated within the chamber according to the ignition operation, thus generated plasma is maintained by applying voltage for maintaining plasma, to a pair of electrodes in the chamber. In the state of plasma maintaining, the changeover circuit 26 connects the contact point S1 to the ground potential, and separates the output end A from the ground potential. With this switching, the voltage output Va having a half peak value of the voltage output Vab of the radio frequency output circuit in the same phase is delivered from the output end A, and the voltage output Vb having a half peak value of the voltage output Vab of the radio frequency output circuit in antiphase is delivered from the output end B.

FIG. 6D and FIG. 6E illustrate modification examples of the second configuration. In the configuration example as shown in FIG. 6D, the changeover circuit 26B is provided between the output end B and the ground potential, and the output end B is connected with or separated from the ground potential. In the configuration example as shown in FIG. 6D, the changeover circuit 26B connects the contact point S2 to the ground, thereby switching the output end B to be at ground potential. With this switching, the voltage output Vb of the output end B becomes ground voltage, and the voltage output Va having the same peak value of the voltage output Vab of the radio frequency output circuit in antiphase, is delivered from the output end A.

In the configuration example as shown in FIG. 6E, two capacitive elements Ca and Cb of the series circuit and two switching elements SW1 and SW2 constitute a bridge circuit, and a connection point between the two capacitive elements and another connection point between the switching elements are both grounded. In this configuration of the changeover circuit 26C, the switching element SW1 is activated and the switching element SW2 is turned off, thereby establishing a circuit having the same configuration as FIG. 6A, whereas the switching element SW2 is activated and the switching element SW1 is turned off, thereby establishing a circuit having the same configuration as FIG. 6D.

(Third Configuration and Operations of the Changeover Circuit According to the Present Invention)

Figure 7A:
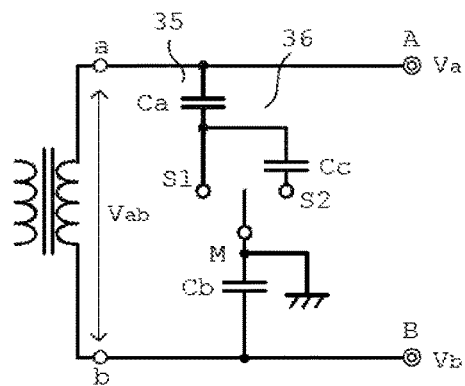
Figure 7A:
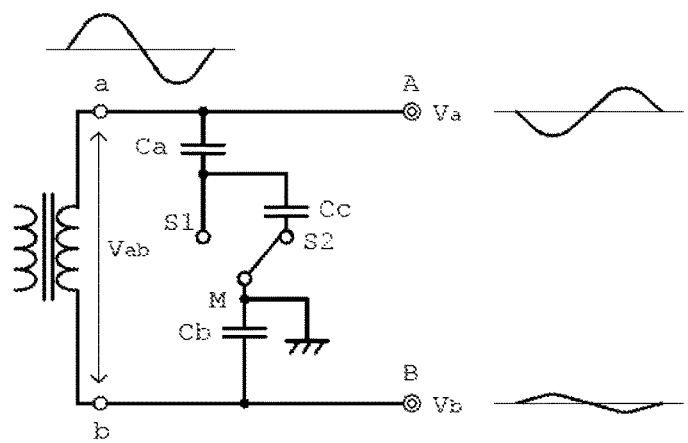
Figure 7A:
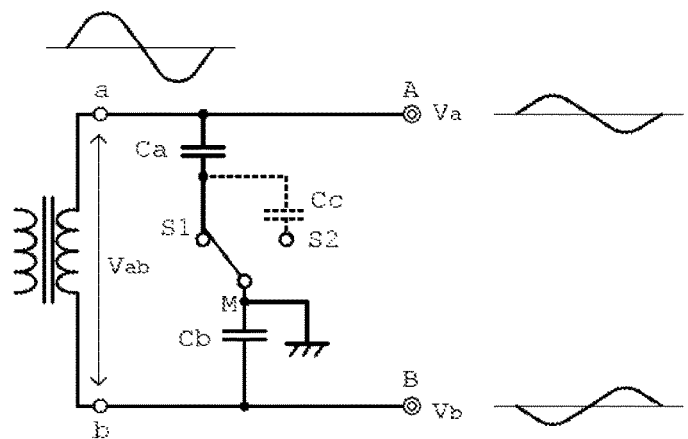

FIG. 7 illustrates the third configuration example and operations of the changeover circuit according to the present invention. In FIG. 7, the radio frequency output circuit is not shown, and there is illustrated the configuration example of the series circuit and the changeover circuit provided in the voltage divider.

FIG. 7A illustrates a schematic configuration, and FIG. 7B and FIG. 7C illustrate respectively the ignition operation time for igniting plasma, and the state of maintaining the plasma after the ignition, when voltage is supplied from the radio frequency power source device to the plasma load.

In FIG. 7A, the voltage divider 34 is provided with the series circuit 35 and the changeover circuit 36, and divides the output Vab between the output ends a and b of the radio frequency output circuit, along with switching the outputs, thereby delivering the voltage output Va from the output end A, and delivering the voltage output Vb from the output end B.

The changeover circuit 36 is a switching element to connect in a switching manner, the end of the second capacitive element Cb and the ground potential, with the first capacitive element Ca, or the third capacitive element Cc connected in series with the first capacitive element Ca. In the configuration as shown in FIG. 7A, the contact point S1 is provided for connection and separation between the first capacitive element Ca and the second capacitive element Cb, and the contact point S2 is provided for connection and separation between the third capacitive element Cc and the second capacitive element Cb.

Since the third capacitive element Cc is connected in series with the first capacitive element Ca, when it is switched to the contact point S1 side, the first capacitive element Ca and the second capacitive element Cb constitute the series circuit 35, and the middle point thereof is put at ground potential. On the other hand, when it is switched to the contact point S2 side, the first capacitive element Ca, the third capacitive element Cc, and the second capacitive element Cb form the series circuit 35, and the connection point between the third capacitive element Cc and the second capacitive element Cb is put at ground potential.

The changeover circuit 36 performs switching between the contact point S1 and the contact point S2, thereby changing a capacity ratio of the series circuit comprising the capacitive elements in series, with respect to the ground potential, causing a change of the ratio in dividing the AC voltage applied to both ends of the series circuit, and this allows switching between the output voltage delivered from the output end A and the output voltage delivered from the output end B.

When the changeover circuit 36 is switched to the contact point S2 side, the series circuit 35 comprises the capacitive element Ca and the capacitive element Cc on the output end A side with respect to the ground potential, and the second capacitive element Cb on the output end B side. Therefore, assuming that each capacitive element has equal capacity, the voltage output Va on the output end A becomes high, and the voltage output Vb on the output end B becomes low, when voltage is divided.

On the other hand, when the changeover circuit 36 switches to the contact point S1, the series circuit 35 comprises the capacitive element Ca on the output end A side and the second capacitive element Cb on the output end B side, with respect to the ground potential. Therefore, assuming that both capacitive elements have equal capacities, each of the voltage output Va at the output end A and the voltage output Vb at the output end B becomes a half of the voltage output Vab of the radio frequency output circuit, when voltage is divided.

FIG. 7A illustrates a configuration example where the changeover circuit 36 forms the series circuit comprising the first capacitive element Ca and the third capacitive element Cc on the output end A side. On the other hand, by inversing the connection relationship, the changeover circuit 36 may be configured to form a series circuit comprising the second capacitive element Cb and the third capacitive element Cc on the output end B side.

Ignition Operation Time:

FIG. 7B illustrates an example where the ground potential is connected to the contact point S2 side of the changeover circuit 36, thereby forming a series circuit that connects the series circuit of the first capacitive element Ca and the third capacitive element Cc, with the second capacitive element Cb, putting the middle point at ground potential.

At the ignition operation time, the changeover circuit 36 connects the ground potential on the contact point S2 side. With this connection, the voltage output Va on the output end A and the voltage output Vb on the output end B may have peak values obtained by dividing the voltage output Vab of the radio frequency output circuit, according to the capacity ratio between the series circuit of the first capacitive element Ca and the third capacitive element Cc, and the second capacitive element Cb, and those voltage outputs are delivered in antiphase with each other. In the example as shown in FIG. 7B, high voltage output Va is delivered from the output end A, and low voltage output Vb is delivered from the output end B. Since the voltage output Va becomes higher than half of the voltage output Vab of the radio frequency output circuit, this may facilitate igniting plasma.

State of Plasma Maintaining:

FIG. 7C illustrates the state of plasma maintaining. After plasma is generated in the chamber by the ignition operation, voltage for maintaining plasma is applied to a pair of electrodes in the chamber so as to maintain the plasma. In the state of plasma maintaining, the changeover circuit 36 connects the ground potential to the contact point S1 side. With this switching, the voltage output Va at the output end A and the voltage output Vb at the output end B may have peak values obtained by dividing the voltage output Vab of the radio frequency output circuit, in accordance with the capacity ratio between the first capacitive element Ca and the second capacitive element Cb. Then, from the output end A, the voltage output Va is delivered, having a peak value which is a half of the voltage output Vab of the radio frequency output circuit in the same phase, and from the output end B, the voltage output Vb is delivered, having a peak value which is a half of the voltage output Vab of the radio frequency output circuit in antiphase.

(Fourth Configuration and Operations of the Changeover Circuit According to the Present Invention)

Figure 8A:
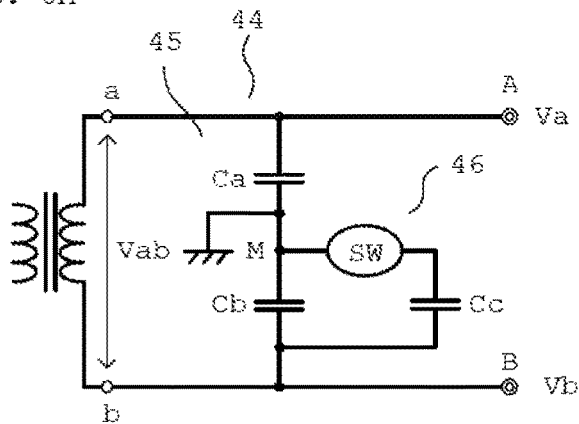
Figure 8A:
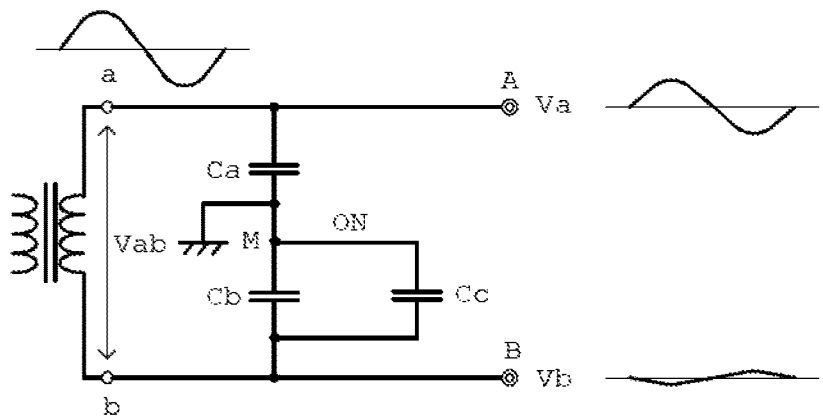
Figure 8A:
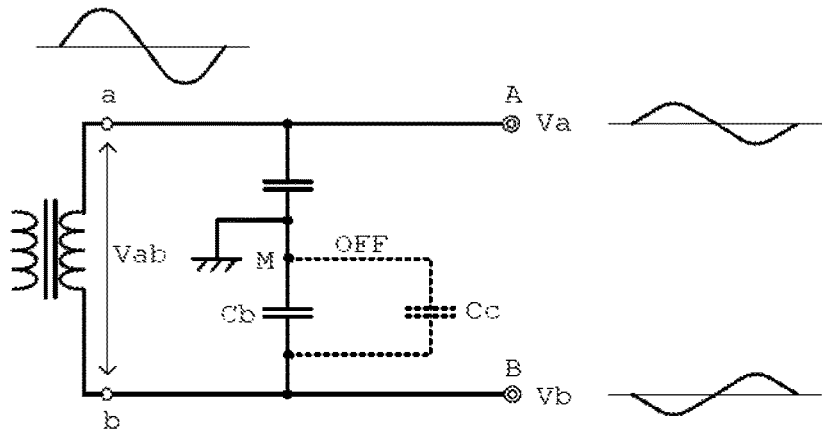
Figure 9A:
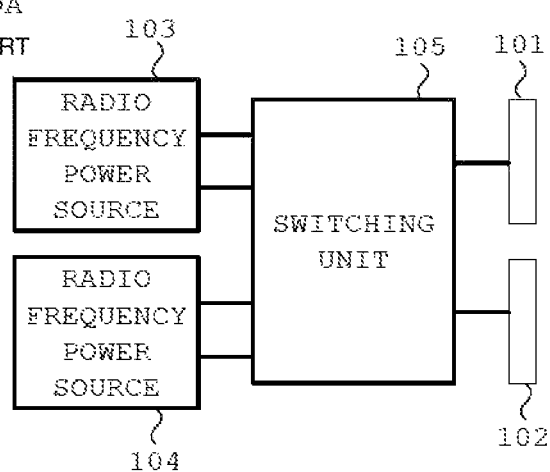
FIG. 9A to FIG. 9C schematically illustrate voltage application according to a dual cathodes system.
Figure 9B:
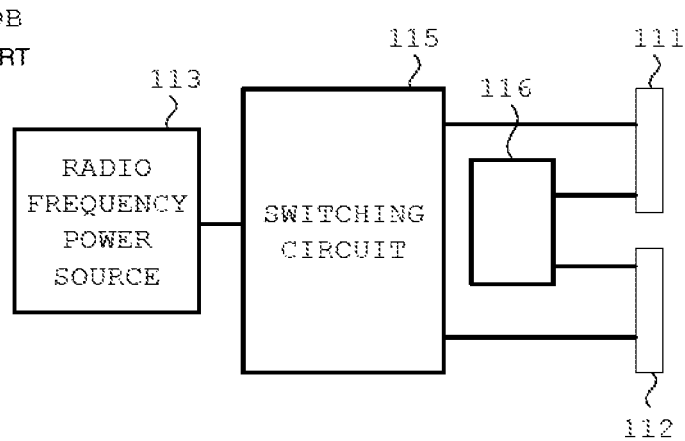
Figure 9C:
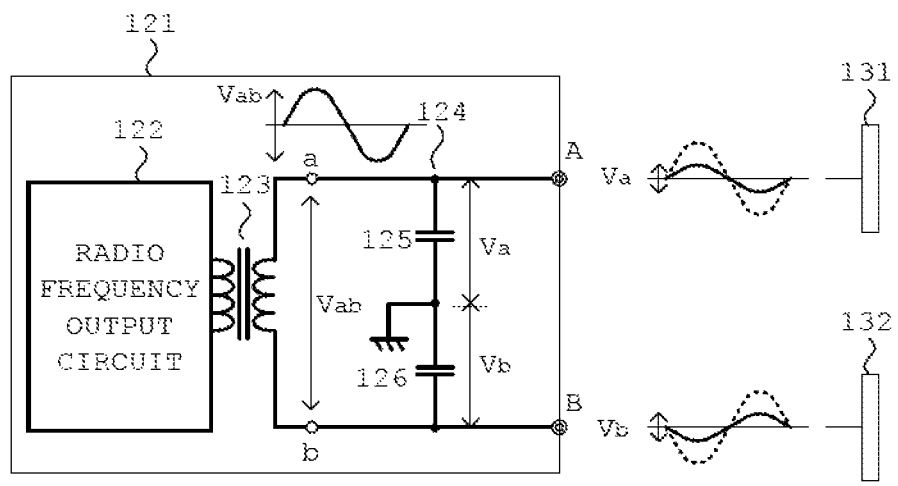
Figure 10:
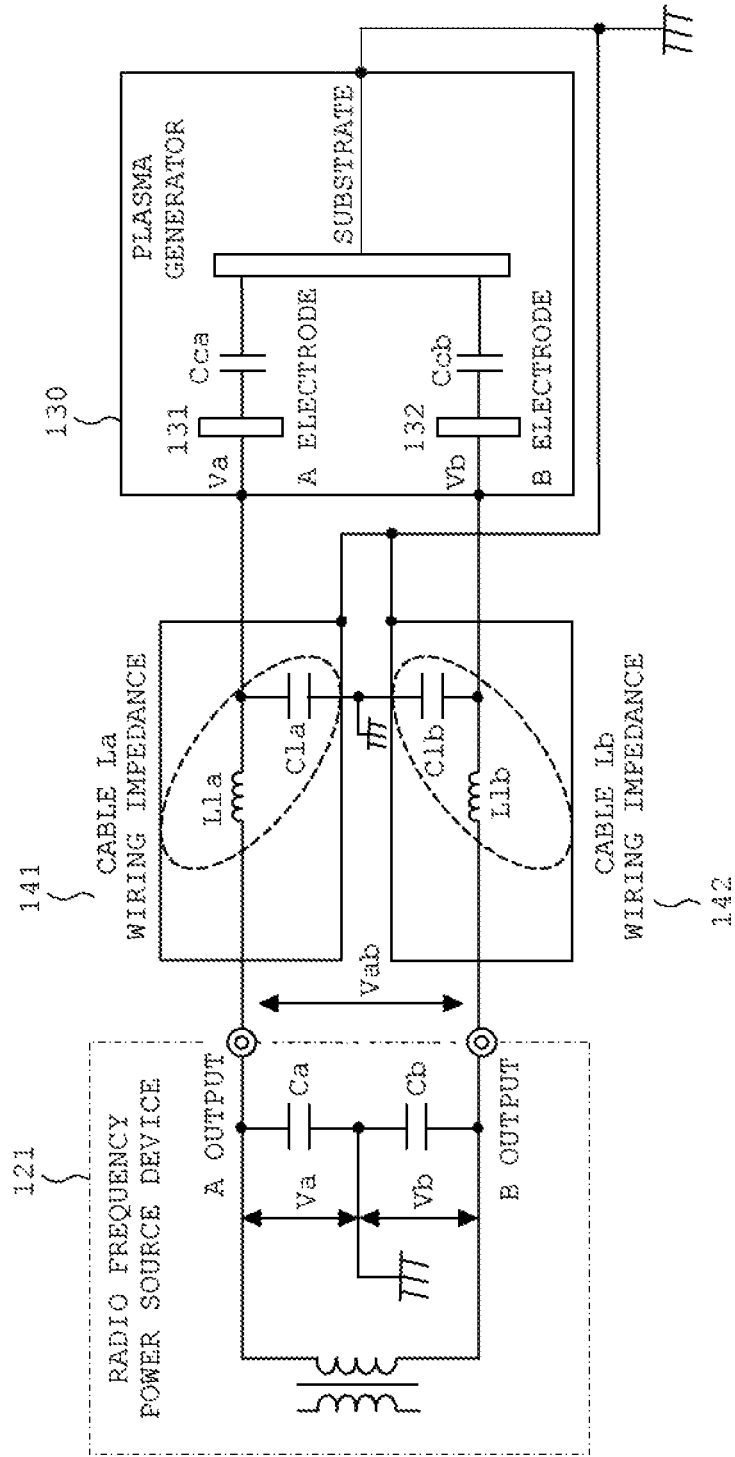
FIG. 10 schematically illustrates voltage application according to the dual cathodes system.

FIG. 8 illustrates the fourth configuration example and operations of the changeover circuit according to the present invention. In FIG. 8, the radio frequency output circuit is not shown, and there is illustrated a configuration example of the series circuit and the changeover circuit provided in the voltage divider.

FIG. 8A illustrates a schematic configuration, and FIG. 8B and FIG. 8C illustrate respectively the ignition operation time for igniting plasma and the state of plasma maintaining after the ignition, when voltage is supplied from the radio frequency power source device to the plasma load.

In FIG. 8A, the voltage divider 44 provided with a series circuit 45 and a changeover circuit 46, divides the output Vab between the output ends a and b of the radio frequency output circuit along with switching the outputs, and then, delivers the voltage output Va from the output end A and delivers the voltage output Vb from the output end B.

The changeover circuit 46 is a switching element that is switched between parallel connection with and separation from the third capacitive element Cc, with the first capacitive element Ca or the second capacitive element Cb.

FIG. 8A illustrates a configuration example for connecting the third capacitive element Cc in parallel with the second capacitive element Cb, or separating therefrom.

When the third capacitive element Cc is connected in parallel with the second capacitive element Cb, the series circuit 45 forms a circuit in series, by connecting the first capacitive element Ca with the parallel circuit of the second capacitive element Cb and the third capacitive element Cc, and puts the middle point of the series circuit at ground potential.

When the third capacitive element Cc is separated from the parallel connection with the second capacitive element Cb, the series circuit 45 becomes the series circuit of the first capacitive element Ca and the second capacitive element Cb, and puts the middle point at ground potential.

The changeover circuit 46 performs switching at the switching element SW, thereby changing a capacity ratio of the series circuit comprising the capacitive elements in series, with respect to the ground potential, causing a change of the ratio in dividing the AC voltage applied to both ends of the series circuit, and this allows switching between the voltage output delivered from the output end A and the voltage output delivered from the output end B.

When the switching element SW is closed in the changeover circuit 46, the series circuit 45 becomes the circuit connecting the first capacitive element Ca in series with the parallel circuit of the second capacitive element Cb and the third capacitive element Cc, and assuming each capacitive element has equal capacity, the voltage output Va at the output end A becomes high, and the voltage output Vb at the output end B becomes low, according to voltage division.

On the other hand, when the switching element SW is open in the changeover circuit 46, the series circuit 45 becomes the circuit connecting the first capacitive element Ca and the second capacitive element Cb in series, and assuming each capacitive element has the same capacity, the voltage output Va at the output end A and the voltage output Vb at the output B become a half of the voltage output Vab of the radio frequency output circuit, respectively, by dividing the voltage.

FIG. 8A illustrates the configuration example where the changeover circuit 46 connects the second capacitive element Cb in parallel with the third capacitive element Cc. It is further possible to invert the connecting relationship, and the changeover circuit 46 may connect the first capacitive element Ca in parallel with the third capacitive element Cc.

Ignition Operation Time:

In the example as shown in FIG. 8B, the switching element SW in the changeover circuit 46 is closed to connect the third capacitive element Cc in parallel with the second capacitive element Cb to form a parallel circuit, thereby forming the series circuit of the first capacitive element Ca and the parallel circuit, and the contact point between the first capacitive element Ca and the parallel circuit is put at ground potential.

At the ignition operation time, the changeover circuit 46 closes the switching element SW, so that the voltage output Va at the output end A and the voltage output Vb at the output end B have peak values obtained by dividing the voltage output Vab of the radio frequency output circuit, in accordance with the capacity ratio of the first capacitive element Ca, and the parallel circuit of the second capacitive element Cb and the third capacitive element Cc. Then, the voltage outputs Va and Vb are delivered respectively in antiphase with each other. In the example as shown in FIG. 8B, high voltage output Va is delivered from the output end A, and low voltage output Vb is delivered from the output end B. The voltage output Va becomes higher than a half of the voltage output Vab of the radio frequency output circuit, thus facilitating ignition of plasma.

State of Plasma Maintaining:

FIG. 8C indicates the state of plasma maintaining. After plasma is generated in the chamber by the ignition operation, voltage for maintaining the plasma is applied to the pair of electrodes in the chamber, so as to maintain the plasma thus generated. In the state of plasma maintaining, the changeover circuit 46 opens the switching element SW. With this switching, the voltage output Va at the output end A and the voltage output Vb at the output end B may have peak values obtained by dividing the voltage output Vab of the radio frequency output circuit, in accordance with the capacity ratio of the first capacitive element Ca and the second capacitive element Cb, and the voltage output Va having a half peak value of the voltage output Vab of the radio frequency output circuit in the same phase is delivered from the output end A, and the voltage output Vb having a half peak value of the voltage output Vab of the radio frequency output circuit in antiphase is delivered from the output end B.

The preferred embodiments and modifications described above are examples of the radio frequency power source device and the power source for dual cathodes relating to the present invention. The present invention is not limited to those exemplary embodiments and various modifications are possible. All such modifications are intended to be included within the scope of the invention.

INDUSTRIAL APPLICABILITY

The radio frequency power source device and the power source for dual cathodes according to the present invention are applicable to usage for applying AC voltage in antiphase with each other, such as a film forming apparatus and a sputtering apparatus which are provided with a pair of electrodes in a chamber.

DESCRIPTION OF SYMBOLS

A, B output end
C1a, C1b capacitance
Ca capacitive element
Cb capacitive element
D1, D2 diode
Ic current
Id set current
Ii ignition current
Io current
L1a, L1b inductance
M middle point
Q1 switching element
S1, S2 contact point
SW switching element
SW1 switching element
SW2 switching element
Va, Vb output voltage
Vab output voltage
Vc predetermined output voltage
Vin DC voltage
a, b output end
1 radio frequency power source device
2 AC power source
3 radio frequency output circuit
3a rectifier
3b snubber circuit
3c chopper circuit
3d inverter circuit
3e transformer
4 voltage divider
5 series circuit
6 changeover circuit
7 control circuit
10 plasma generator
11a, 11b wiring cable
12 changeover circuit
14 voltage divider
15 series circuit
16 changeover circuit
16A, 16B, 16C switch circuit
24 voltage divider
25 series circuit
26 changeover circuit
34 voltage divider
35 series circuit
36 changeover circuit
44 voltage divider
45 series circuit
46 changeover circuit
101 electrode
102 electrode
103 radio frequency power source
104 radio frequency power source
105 switching unit
111, 112 electrode
113 radio frequency power source
115 switching circuit
116 AC power source
121 radio frequency power source device
122 radio frequency output circuit
123 transformer
124 voltage divider
125, 126 capacitive element
130 plasma generator
131, 132 electrode
141, 142 wiring cable

What is claimed is:

1. A radio frequency power source device for delivering AC voltage outputs in antiphase with each other, with respect to ground potential from two output ends comprising,
an AC power source,
a radio frequency output circuit configured to convert source voltage from the AC power source into radio frequency voltage at a given frequency and to deliver the radio frequency voltage, and
a voltage divider configured to divide the radio frequency voltage delivered from the radio frequency output circuit into AC voltage outputs in antiphase with each other, with respect to ground potential, wherein,
the voltage divider comprises,
a series circuit configured to connect two capacitive elements in series, a first capacitive element and a second capacitive element, putting a middle point between output ends of the radio frequency output circuit at the ground potential, and
a changeover circuit configured to connect a connection state of one of the output ends of the radio frequency output circuit and/or the ground by switching, with at least either one of the capacitive elements of the series circuit with respect to the output terminal side of a capacitive measured signal, or a middle point side, varying a ratio between voltages across each of the two capacitive elements with respect to the ground potential, so that high voltage and low voltage are delivered by switching.

2. The radio frequency power source device according to claim 1, wherein,
the changeover circuit comprises a switch circuit, the switch circuit short-circuiting or open-circuiting between the output end of the radio frequency output circuit on one capacitive element side and the ground potential, across at least either one of the two capacitive elements of the series circuit,
a short-circuiting operation of the switch circuit makes voltage to zero on the output end of the radio frequency output circuit on the one capacitive element side, and sets a voltage output on the output end on the other capacitive element side, as the voltage output of the radio frequency output circuit, and
an open-circuiting operation of the switch circuit sets the voltage outputs obtained by dividing the voltage output of the radio frequency output circuit on both capacitive element sides in accordance with capacities of the two capacitive elements, as the voltage outputs of the radio frequency output circuit on both the capacitive element sides.

3. The radio frequency power source device according to claim 2, wherein,
the switch circuit is provided between the one output end of the radio frequency output circuit and the ground potential, or the switch circuit is provided between the one output end of the radio frequency output circuit and the middle point, or the switch circuit is connected in parallel with the one capacitive element.

4. The radio frequency power source device according to claim 1, wherein,
the changeover circuit comprises a changeover switch configured to connect the ground potential in switching manner, with the middle point of the two capacitive elements in the series circuit, and with the output end of the radio frequency output circuit on one capacitive element side, and
according to the changeover switch,
switching of the ground potential to connect with the middle point between the two capacitive elements of the series circuit sets the voltage outputs obtained by dividing the voltage output of the radio frequency output circuit on both capacitive element sides, in accordance with capacities of the two capacitive elements, as the voltage outputs of the radio frequency output circuit on both the capacitive element sides, and
switching of the ground potential to connect with the output end of the radio frequency output circuit on the one capacitive element side makes voltage to zero on the output end of the radio frequency output circuit on the one capacitive element side, and sets a voltage output on the output end on the other capacitive element side, as the voltage output of the radio frequency output circuit.

5. The radio frequency power source device according to claim 1, wherein,
the changeover circuit comprises a changeover switch configured to connect a third capacitive element in series with either one of the two capacitive elements in the series circuit,
in switching by the changeover switch,
connecting the third capacitive element in series makes a peak value of the voltage higher on the output end of the radio frequency output circuit on the one capacitive element side, than the peak value on the other capacitive element side, and
separating of the third capacitive element sets the voltage outputs obtained by dividing the voltage output of the radio frequency output circuit on both capacitive elements sides, in accordance with capacities of the two capacitive elements, as the voltage outputs of the radio frequency output circuit on both the capacitive element sides.

6. The radio frequency power source device according to claim 1, wherein,
the changeover circuit comprises a changeover switch configured to connect a fourth capacitive element in parallel with either one of the two capacitive elements in the series circuit,
in switching by the changeover switch, connecting the fourth capacitive element in parallel makes a peak value of the voltage higher on the output end of the radio frequency output circuit on the one capacitive element side, than the peak value on the output end on the other capacitive element side, and
separating of the fourth capacitive element sets the voltage outputs obtained by dividing the voltage output of the radio frequency output circuit on both capacitive element sides, in accordance with capacities of the two capacitive elements, as the voltage outputs of the radio frequency output circuit on both the capacitive element sides.

7. A power source for dual cathodes for applying AC voltage outputs in antiphase with each other respectively to two electrodes in a plasma chamber, comprising,
a radio frequency power source device, and
a control circuit configured to control an ignition operation state for igniting plasma in the plasma chamber, and a plasma maintaining state for maintaining the plasma being ignited, wherein,
the radio frequency power source device for delivering AC voltage outputs in antiphase with each other, with respect to ground potential from two output ends comprising, an AC power source, a radio frequency output circuit configured to convert source voltage from the AC power source into radio frequency voltage at a given frequency and to deliver the radio frequency voltage, and a voltage divider configured to divide the radio frequency voltage delivered from the radio frequency output circuit into AC voltage outputs in antiphase with each other, with respect to ground potential, wherein, the voltage divider comprises, a series circuit configured to connect two capacitive elements in series, a first capacitive element and a second capacitive element, putting a middle point between output ends of the radio frequency output circuit at the ground potential, and a changeover circuit configured to connect a connection state of one of the output ends of the radio frequency output circuit and/or the ground by switching, with at least either one of the capacitive elements of the series circuit with respect to the output terminal side of a capacitive measured signal, or a middle point side, varying a ratio between voltages across each of the two capacitive elements with respect to the ground potential, so that high voltage and low voltage are delivered by switching, the control circuit controls the changeover circuit according to current passing through the electrodes, thereby varying a voltage ratio of the ignition operation state for outputting a high voltage and the voltage ratio of the plasma maintaining state for outputting a low voltage, increases the voltage ratio on the electrode for igniting plasma out of the two electrodes in the ignition operation state, equalizes the voltage ratio on the two electrodes in the plasma maintaining state, and when the current passing through the electrode for igniting plasma reaches or exceeds a set value in the ignition operation state, the changeover circuit switches the connection state, thereby changing the state to the plasma maintaining state.

8. The power source for dual cathodes according to claim 7, wherein, the changeover circuit comprises a switch circuit, the switch circuit short-circuiting or open-circuiting between the output end of the radio frequency output circuit on one capacitive element side and the ground potential, across at least either one of the two capacitive elements of the series circuit, a short-circuiting operation of the switch circuit makes voltage to zero on the output end of the radio frequency output circuit on the one capacitive element side, and sets a voltage output on the output end on the other capacitive element side, as the voltage output of the radio frequency output circuit, and an open-circuiting operation of the switch circuit sets the voltage outputs obtained by dividing the voltage output of the radio frequency output circuit on both capacitive element sides in accordance with capacities of the two capacitive elements, as the voltage outputs of the radio frequency output circuit on both the capacitive element sides.

9. The power source for dual cathodes according to claim 8, wherein, the switch circuit is provided between the one output end of the radio frequency output circuit and the ground potential, or the switch circuit is provided between the one output end of the radio frequency output circuit and the middle point, or the switch circuit is connected in parallel with the one capacitive element.

10. The power source for dual cathodes according to claim 7, wherein, the changeover circuit comprises a changeover switch configured to connect the ground potential in switching manner, with the middle point of the two capacitive elements in the series circuit, or with the output end of the radio frequency output circuit on one capacitive element side, and according to the changeover switch, switching of the ground potential to connect with the middle point between the two capacitive elements of the series circuit makes voltage to zero on the output end of the radio frequency output circuit on the one capacitive element side, and sets a voltage output on the output end on the other capacitive element side, as the voltage output of the radio frequency output circuit, and switching of the ground potential to connect with the output end of the radio frequency output circuit on the one capacitive element side sets the voltage outputs obtained by dividing the voltage output of the radio frequency output circuit on both capacitive element sides, in accordance with capacities of the two capacitive elements, as the voltage outputs of the radio frequency output circuit on both the capacitive element sides.

11. The power source for dual cathodes according to claim 7, wherein, the changeover circuit comprises a changeover switch configured to connect a third capacitive element in series with either one of the two capacitive elements in the series circuit, in switching by the changeover switch, connecting the third capacitive element in series makes a peak value of the voltage higher on the output end of the radio frequency output circuit on the one capacitive element side, than the peak value on the other capacitive element side, and separating of the third capacitive element sets the voltage outputs obtained by dividing the voltage output of the radio frequency output circuit on both capacitive elements sides, in accordance with capacities of the two capacitive elements, as the voltage outputs of the radio frequency output circuit on both the capacitive element sides.

12. The power source for dual cathodes according to claim 7, wherein, the changeover circuit comprises a changeover switch configured to connect a fourth capacitive element in parallel with either one of the two capacitive elements in the series circuit, in switching by the changeover switch, connecting the fourth capacitive element in parallel makes a peak value of the voltage higher on the output end of the radio frequency output circuit on the one capacitive element side, than the peak value on the output end on the other capacitive element side, and separating of the fourth capacitive element sets the voltage outputs obtained by dividing the voltage output of the radio frequency output circuit on both capacitive element sides, in accordance with capacities of the two capacitive elements, as the voltage outputs of the radio frequency output circuit on both the capacitive element sides.

* * * * *